United States Patent
Lee et al.

(10) Patent No.: US 8,004,081 B2
(45) Date of Patent: Aug. 23, 2011

(54) SEMICONDUCTOR CHIP PACKAGE AND PRINTED CIRCUIT BOARD HAVING THROUGH INTERCONNECTIONS

(75) Inventors: Jong-joo Lee, Suwon-si (KR); Seung-duk Baek, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 168 days.

(21) Appl. No.: 12/464,921

(22) Filed: May 13, 2009

(65) Prior Publication Data

US 2009/0283894 A1    Nov. 19, 2009

(30) Foreign Application Priority Data

May 14, 2008    (KR) .................. 10-2008-0044720

(51) Int. Cl.
*H01L 23/04*    (2006.01)
(52) U.S. Cl. ............ 257/730; 257/E23.141; 257/E23.01
(58) Field of Classification Search .................. 257/691, 257/692, E23.141, E23.01, 678, 686, 730; 174/250, 261, 262
See application file for complete search history.

(56) References Cited

U.S. PATENT DOCUMENTS

| 6,111,756 | A | * | 8/2000 | Moresco | 361/735 |
| 7,154,356 | B2 | | 12/2006 | Brunette et al. | |
| 2004/0251529 | A1 | * | 12/2004 | Lee et al. | 257/686 |

FOREIGN PATENT DOCUMENTS

| JP | 2001-148448 | 5/2001 |
| JP | 2002-329802 | 11/2002 |
| JP | 2007-180292 | 7/2007 |

* cited by examiner

*Primary Examiner* — Thomas L Dickey
*Assistant Examiner* — Nikolay Yushin
(74) *Attorney, Agent, or Firm* — Stanzione & Kim, LLP

(57) ABSTRACT

A semiconductor chip package includes a signal interconnection penetrating a semiconductor chip and transmitting a signal to the semiconductor chip and a power interconnection and a ground interconnection penetrating the semiconductor and supplying power and ground to the semiconductor chip. The power interconnection and the ground interconnection are arranged to neighbor each other adjacent to the signal interconnection.

19 Claims, 9 Drawing Sheets

SEMICONDUCTOR CHIP PACKAGE AND PRINTED CIRCUIT BOARD HAVING THROUGH INTERCONNECTIONS

CROSS-REFERENCE TO RELATED APPLICATIONS

This application claims priority under 35 U.S.C. §119 from Korean Patent Application No. 10-2008-0044720, filed on May 14, 2008, in the Korean Intellectual Property Office, the disclosure of which is incorporated herein in its entirety by reference.

BACKGROUND OF THE INVENTION

1. Field of the Invention

The present general inventive concept relates to interconnection formed in a semiconductor chip package and a printed circuit board, and more particularly, to a semiconductor chip package, a printed circuit board having through interconnections, and an apparatus having at least one of the semiconductor chip package and the printed circuit board.

2. Description of the Related Art

As compact and high functional electronic products are becoming popular, electronic parts used in the electronic products need to be highly integrated and operated at high speed. Accordingly, in the semiconductor industry, a packaging technology has been continuously developed to satisfy the conditions of miniaturization and reliable mounting. In particular, to meet a demand in the market for high integration of unit electronic devices, a variety of technologies about a semiconductor chip package having a stack structure are under development.

As one of the technologies about a semiconductor chip package having a stack structure, a through-substrate via interconnection (TSVI) technology for electrically connecting an upper chip and a lower chip by forming a through interconnection in a semiconductor chip, that is, a semiconductor substrate, has been suggested.

However, the semiconductor chip is usually formed of a semiconductor substrate, for example, a silicon substrate. Accordingly, the through interconnection formed in the semiconductor substrate has a problem that a signal transmission characteristic or power supply quality is deteriorated compared to a typical interconnection wiring such as wire bond or bump. In particular, when a high speed signal is transmitted, the signal transmission characteristic is further deteriorated.

SUMMARY OF THE INVENTION

The present general inventive concept provides interconnection to one or more semiconductors or one or more printed circuit board.

The present general inventive concept also provides a semiconductor chip package having interconnections.

The present general inventive concept also provides a printed circuit board.

The present general inventive concept also provides an apparatus to perform an operation using a semiconductor chip package having one or more semiconductors connected with interconnections or using a circuit board having one or more substrates connected with interconnections.

Additional aspects and utilities of the present general inventive concept will be set forth in part in the description which follows and, in part, will be obvious from the description, or may be learned by practice of the general inventive concept.

In an embodiment and utilities of the present general inventive concept, there is provided a semiconductor chip package including a signal interconnection penetrating a semiconductor chip to transmit a signal to the semiconductor chip and a power interconnection and a ground interconnection penetrating the semiconductor to supply power and ground to the semiconductor chip, wherein the power interconnection and the ground interconnection may be arranged to neighbor each other adjacent to the signal interconnection.

The total number of the power interconnection and the ground interconnection arranged to neighbor each other adjacent to the signal interconnection may be at least three. The number of each of the power interconnection and the ground interconnection arranged to neighbor each other adjacent to the signal interconnection may be the same plural number.

The power interconnection and the ground interconnection arranged to neighbor each other adjacent to the signal interconnection are respectively arranged on a concentric circle having a distance from the signal interconnection.

The power interconnections and the ground interconnections arranged to neighbor one another adjacent to the signal interconnection are alternately arranged on a concentric circle having a distance from the signal interconnection.

The signal interconnection may be a plurality of signal interconnections, and parts of the power interconnections and the ground interconnections arranged to neighbor one another adjacent to the signal interconnections may be arranged at positions where concentric circles, each having a distance from at least two signal interconnections, overlap each other.

The distance from the signal interconnection to the power interconnection or the ground interconnection, the diameter of each of the signal interconnection, the power interconnection, and the ground interconnection, or the arrangement and numbers of the power interconnection and the ground interconnection arranged to neighbor each other adjacent to the signal interconnection may be determined to have a characteristic impedance required by a signal to be transmitted to the signal interconnection.

The power interconnection and the ground interconnection arranged to neighbor each other adjacent to the signal interconnection may be respectively used as a current return path with respect to a signal current supplied to the signal interconnection.

The semiconductor chip package may further include a chip pad electrically connecting the signal interconnection and the semiconductor chip, wherein the chip pad covers both of the power interconnection and the ground interconnection arranged to neighbor each other adjacent to the signal interconnection.

The semiconductor chip package may further include a conductive wiring supplying power and ground to the semiconductor chip via the power interconnection and the ground interconnection.

The semiconductor chip may be provided in a plural number, and the signal interconnection, the power interconnection, and the ground interconnection penetrate all semiconductor chips.

The semiconductor chip may be provided in a plurality number, and the signal interconnection, the power interconnection, and the ground interconnection penetrate some of the semiconductor chips located in a lower portion of a stack of the semiconductor chips.

The semiconductor chip package may further include a connection unit electrically connected to the signal interconnection, the power interconnection, and the ground interconnection at end portions of the signal interconnection, the power interconnection, and the ground interconnection and electrically connecting an external device or a printed circuit board.

In an embodiment and utilities of the present general inventive concept, there is also provided a printed circuit board having a multilayer structure including a plurality of substrates comprises a signal interconnection penetrating at least one of the substrates to transmit a signal and a power interconnection and a ground interconnection penetrating the substrate that the signal interconnection penetrates and to respectively supply power and ground, wherein the power interconnection and the ground interconnection may be arranged to neighbor each other adjacent to the signal interconnection.

The total number of the power interconnection and the ground interconnection arranged to neighbor each other adjacent to the signal interconnection may be at least three. The number of each of the power interconnection and the ground interconnection arranged to neighbor each other adjacent to the signal interconnection may be the same plural number.

The power interconnection and the ground interconnection arranged to neighbor each other adjacent to the signal interconnection may be respectively arranged on a concentric circle having a distance from the signal interconnection.

The power interconnections and the ground interconnections arranged to neighbor one another adjacent to the signal interconnection may be alternately arranged on the concentric circle.

The power interconnections and the ground interconnections arranged to neighbor one another adjacent to the signal interconnection may be arranged on a concentric circle having a distance from the signal interconnection and on a linear line forming an equal angle with respect to the signal interconnection.

The signal interconnection may be a plurality of signal interconnections, and parts of the power interconnections and the ground interconnections arranged to neighbor one another adjacent to the signal interconnections are arranged at positions where concentric circles, each having a distance from at least two signal interconnections, overlap each other.

In an embodiment and utilities of the present general inventive concept, there is also provided an apparatus including a semiconductor chip package including a signal interconnection penetrating a semiconductor chip and transmitting a signal to the semiconductor chip, and a power interconnection and a ground interconnection to penetrate the semiconductor and to supply power and ground to the semiconductor chip, wherein the power interconnection and the ground interconnection are arranged to neighbor each other adjacent to the signal interconnection, and a processing unit connected to the semiconductor chip package through the signal interconnection and the power and ground interconnections to control the semiconductor chip package.

In an embodiment and utilities of the present general inventive concept, there is also provided an apparatus including a printed circuit board having a multilayer structure including a plurality of substrates, the printed circuit board having a signal interconnection penetrating at least one of the substrates and transmitting a signal, and a power interconnection and a ground interconnection penetrating the substrate that the signal interconnection penetrates and respectively supplying power and ground, wherein the power interconnection and the ground interconnection are arranged to neighbor each other adjacent to the signal interconnection, and a processing unit connected to the printed circuit board through the signal interconnection and the power and ground interconnections to control the printed circuit board.

The apparatus may further include one of more communication lines to connect the processing unit and the printed circuit board.

At least one of one or more communication lines may be disposed in a direction parallel to a center axis of a corresponding one of the signal interconnection and the power and ground interconnections.

In an embodiment and utilities of the present general inventive concept, there is also provided a semiconductor chip package including a plurality of semiconductor chips, and a through interconnection having a signal interconnection disposed in a center common axis passing thorough the semiconductor chips, and having power and ground interconnections disposed in peripheral common axes disposed around the common center axis and passing through the semiconductor chips.

The plurality of semiconductor chips each may include a center common hole to correspond to the signal interconnection, and peripheral common holes to correspond to the power and ground interconnections.

The peripheral common axes may be disposed on a first radial direction line and a second radial direction line, and the first radial direction line and the second radial direction line may be disposed adjacent to each other to have an angle with respect to the center common axis.

The through interconnection may have a length longer than a sum of thicknesses of the semiconductor chips in a direction in which the semiconductor chips overlap.

The semiconductor chips may be stacked in a direction, and the through interconnection may be disposed in the same direction.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

Figure 1:
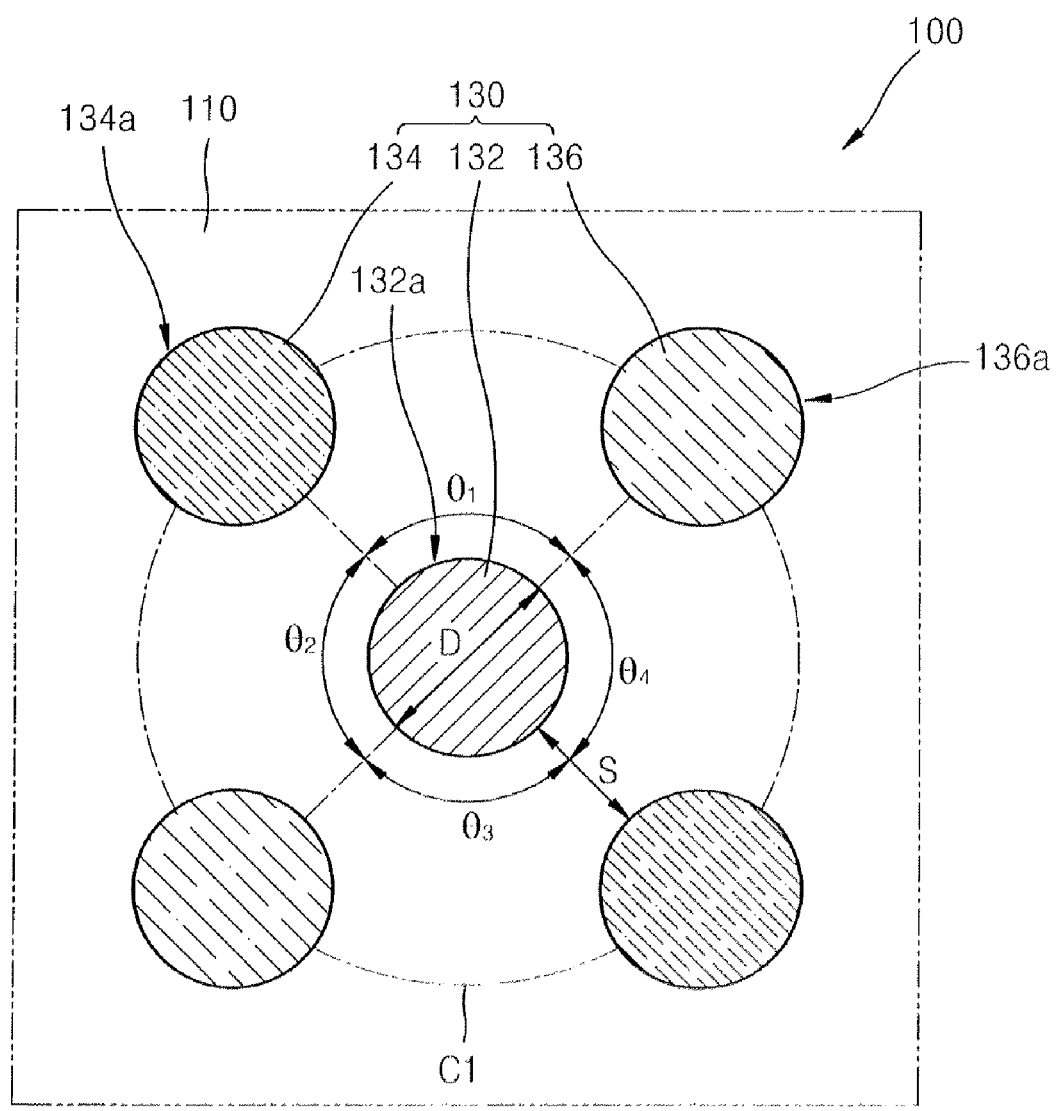
FIG. 1 is a plan view illustrating through interconnections of a semiconductor chip package according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The attached drawings for illustrating exemplary embodiments of the present general inventive concept are referred to in order to gain a sufficient understanding of the present general inventive concept, the merits thereof, and the objectives accomplished by the implementation of the present general inventive concept. Hereinafter, the present general inventive concept will be described in detail by explaining exemplary embodiments of the general inventive concept with reference to the attached drawings. In the following description, when a constituent element is described to be connected to or exist above another constituent element, the constituent element may be directly connected or exist above the other constituent element or a third constituent element may be interposed therebetween. Also, in the drawings, the thickness or size of each constituent element is exaggerated for the convenience and clarity of explanation and portions not related to the explanation are omitted herein. Like reference numerals in the drawings denote like elements. The terms used in the present specification are used to explain the present general inventive concept not to limit the scope of the present invention defined by claims.

FIG. 1 is a plan view illustrating through interconnections 130 of a semiconductor chip package 100 according to an embodiment of the present general inventive concept. Referring to FIG. 1, the through interconnections 130 penetrating a semiconductor chip 110 are formed in the semiconductor chip package 100. The through interconnections 130 include a signal interconnection 132 and one or more poser interconnections, such as a power interconnection 134 and a ground interconnection 136. The signal interconnection 132 may be used to transmit various signals used for the semiconductor chip 110. For example, the signal interconnection 132 may be used to input or output data to be stored in or read from memory cells of the one or more semiconductor chips 110. Also, a control signal to control the operation of the semiconductor chip or semiconductor chips 110 may be input to the signal interconnection 132. The power interconnection 134 and the ground interconnection 136, respectively, supply power and ground needed for the operation of the semiconductor chip 110.

The semiconductor chip package 100 includes one or more semiconductor chips 110 each having one or more common holes 132a, 134a, and 136a formed therein such that the through interconnections 130 are disposed in the corresponding holes of the one or more semiconductor chips. The one or more semiconductor chips 110 can communicate with an external device to receive, store, and transmit data using the through interconnections 130. The external device may be a processing unit connected to the through interconnections 130 to control the semiconductor chip package 100.

The common holes 132a, 134a, and 136a can be formed when the one or more semiconductor chips 110 are disposed to form the semiconductor chip package 100 or can be independently formed when each of the one or more semiconductor chips 110 is formed. Therefore, the through interconnections 130 can be formed when a conductive material is formed in or inserted into the corresponding holes 132a, 134a, and 136a.

It is also possible that the one or more semiconductor chips 110 can communicate with each other to receive, store, and transmit data using the through interconnections 130. In this case, a processing unit can be connected to the through interconnections 130 to control the operation of the semiconductor chip package 100.

Each of the one or more semiconductor chips 110 may include a memory structure to receive data from an external device, to store data in memory cells thereof, and to transmit data to the external device, using the through interconnections 130 formed according to the present general inventive concept. The memory structure is well known, and thus detailed descriptions thereof will be omitted.

The power interconnection 134 and the ground interconnection 136 are arranged to neighbor each other adjacent to the signal interconnection 132. For example, the power interconnection 134 and the ground interconnection 136 are arranged on a concentric circle C1 having a distance S from the signal interconnection 132. The distance may be a substantially same distance (or equidistance) S. Hereinafter, the distance is referred to as equidistance S for the purpose of the explanation of the present general inventive concept. It is possible that the distance may be a distance required to improve a transmission characteristic and/or a power supply quality of the semiconductor chip package 100. Accordingly, the power interconnection 134 and the ground interconnection 136 may surround the signal interconnection 132 positioned at the center thereof. The power interconnection 134 and the ground interconnection 136 surrounding the signal interconnection 132 may have the same number. In this case, the power interconnection 134 and the ground interconnection 136 may be alternately arranged on the concentric circle C1 having the equidistance S from the signal interconnection 132. Also, the angles made by imaginary lines connecting the signal interconnection 132 and each of the power interconnection 134 and the ground interconnection 136 may have the same value ($\theta_1=\theta_2=\theta_3=\theta_4$). That is, the power interconnection 134 and the ground interconnection 136 are arranged at the same interval on the concentric circle C1 having the equidistance S from the signal interconnection 132.

The through interconnections 130 including the signal interconnection 132, and the power interconnection 134 and the ground interconnection 136 surrounding the signal interconnection 132, has a quasi-coaxial structure. This structure has a superior signal transmission characteristic when a high speed signal is transmitted through the signal interconnection 132. Accordingly, the signal interconnection 132 transmitting a high speed signal has a quasi-coaxial structure with the power interconnection 134 and the ground interconnection 136 surrounding the signal interconnection 132. On the other hand, the signal interconnection 132 transmitting a relatively low speed signal may be arranged independently of the arrangement of the power interconnection 134 and the ground interconnection 136 which forms the quasi-coaxial structure.

The characteristic impedance of the through interconnections 130 having the quasi-coaxial structure can be adjusted by varying the equidistance S from the signal interconnection 132 to either the power interconnection 134 or the ground interconnection 136. For example, the same or similar characteristic impedance can be made. When the permittivity of the semiconductor chip 110 surrounding the through interconnections 130, which is, a semiconductor substrate, is relatively large, the characteristic impedance can be adjusted by increasing the equidistance S compared to a case in which the permittivity is relatively small.

Also, the equidistance S can be controlled or adjusted with respect to the signal interconnection 132 according to the number of the power interconnections 134, the number of the ground interconnections 136, and/or the number of a combination of the power interconnections 134 and the ground interconnections 136, that is, when the sum of the numbers of the power interconnection 134 and the ground interconnection 136 surrounding the signal interconnection 132 is relatively greater than a first predetermined number, the characteristic impedance can be adjusted by increasing the equidistance S compared to a case in which the sum of the numbers of the power interconnection 134 and the ground interconnection 136 is relatively smaller than a second predetermined number. The first predetermined number and the second predetermined number can be same or different. It is possible that the first predetermined number and the second predetermined number can be variable according to at least one characteristic of the semiconductor chip 110 of the semiconductor chip package 100. It is also possible that one of the first predetermined number and the second predetermined number is greater than the other one. The Furthermore, the characteristic impedance can be adjusted by making the diameters of the power interconnection 134 and the ground interconnection 136 different from that of the signal interconnection 132. The through interconnections 130 may be formed, for example, in a laser or reactive ion etch (RIE) method. When the through interconnections 130 are formed in the laser method, the diameter D of the through interconnections 130 may have tens of micrometers. When the through interconnections 130 are formed in the RIE method, the diameter D of the through interconnections 130 may have several to tens of micrometers.

The equidistance S can be controlled or adjusted according to a radius of at least one of the signal interconnection 132, the power interconnections 134, and the ground interconnections 136. It is possible that a radius or diameter of the holes 132a, 134a, and 136a can be controlled or adjusted according to the equidistance S.

The through interconnections 130 may be formed after a plurality of the semiconductor chips 110 are all stacked and holes 132a, 134a, and 136a penetrating all semiconductor chips 110 is formed. Also, the through interconnections 130 may be formed by staking one or some of the semiconductor chips 110 and forming a part of the through interconnections 130 and then staking one or some of the semiconductor chips 110 and forming the other part of the through interconnections 130. Also, the through interconnections 130 may be formed by stacking each of the semiconductor chips 110 where a part of the through interconnections 130 are formed. When the through interconnections 130 are completed in the semiconductor chip package 100, a connection unit (not illustrated), for example, a bump, is formed between parts of the through interconnections 130 to be connected to an external device, for example, a processing unit to process data of the semiconductor chip package 100, or an external apparatus to communicate with the semiconductor chip package 100 to receive and transmit the data.

All of the holes 132a, 134a, and 136a may not be disposed on a single line (or a straight line), and all of the through interconnections 130 may not be disposed on a single line (or a straight line). In addition, the power and ground interconnections 134 and 136 may not be disposed on a same radial line from the signal interconnection 132. The power interconnection line 134 can be disposed on a first radial direction line of the signal interconnection 132 to be spaced apart from the signal interconnection 132 by a first distance, and the ground interconnection 136 may be disposed on a second radial direction line of the signal interconnection 132 to be spaced apart from the signal interconnection 132 by a second distance. The first distance and the second distance may be the equidistance S.

Figure 2:
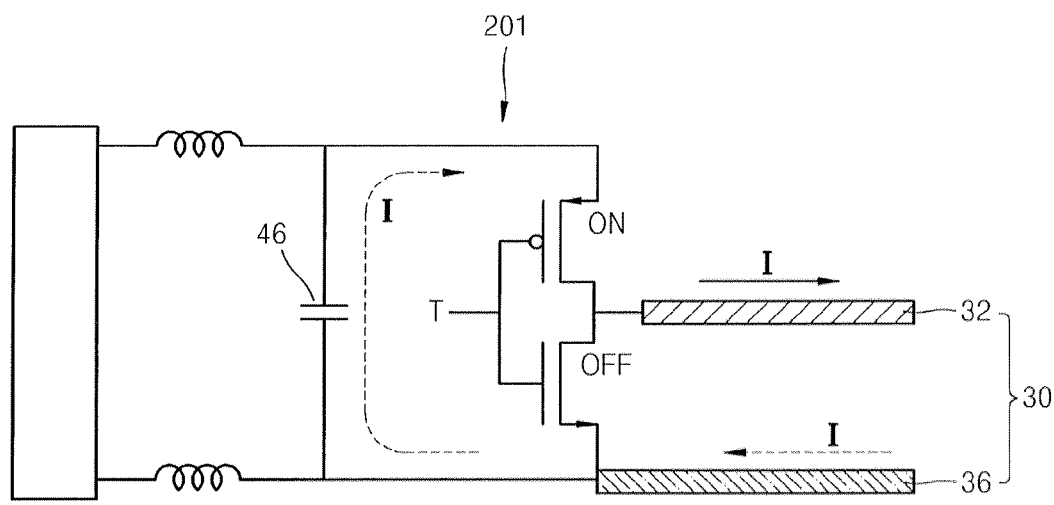
FIG. 2 is an equivalent circuit diagram illustrating the flow of current in a conventional technology.
Figure 3:
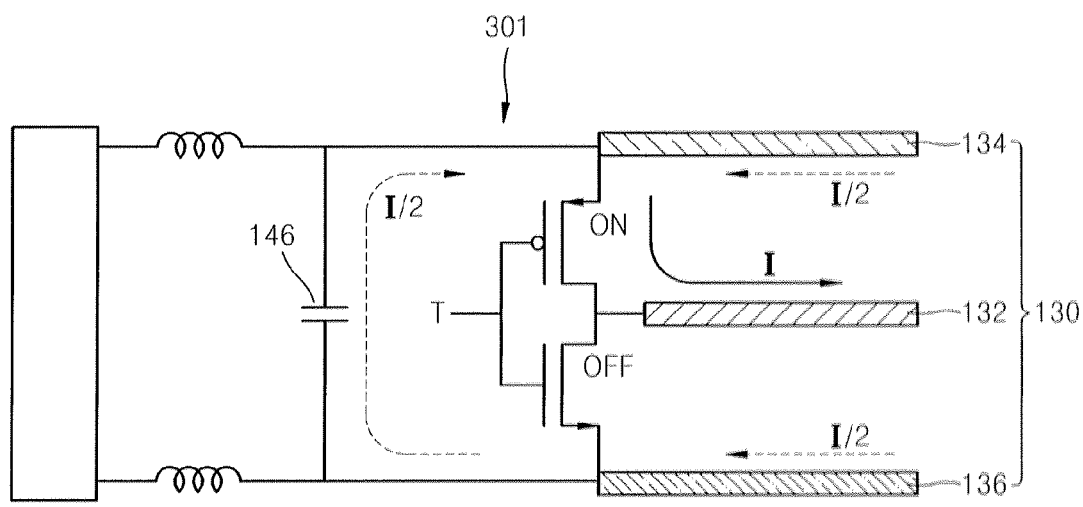
FIG. 3 is an equivalent circuit diagram illustrating the flow of current by the through interconnections of FIG. 1 according to an embodiment of the present general inventive concept.

FIG. 2 is an equivalent circuit diagram illustrating a current flow in an example according to a conventional technology, in which only a ground electrode is adjacent to a signal electrode. FIG. 3 is an equivalent circuit diagram illustrating a current flow by the through interconnections according to an embodiment of the present general inventive concept.

Referring to FIGS. 2 and 3, when a pull-up switching operation occurs according to a potential of a terminal T and a circuit 201, according to the conventional technology, the amount I of current flowing in a signal interconnection 32 must be the same as the amount I of current flowing in a decoupling capacitor 36 or a ground interconnection. In contrast, in the present general inventive concept, the amount I/2 of current flowing in a decoupling capacitor 146, a power interconnection 134 or a ground interconnection 136 is less than the amount I of current flowing in a signal interconnection 132 according to a potential of a terminal T and a circuit 301. Thus, a superior signal transmission characteristic is obtained.

Also, in a current return path of the signal current supplied to the signal interconnection 132, the power interconnection 134 and the ground interconnection 136 are respectively used as a balanced return path having a loop structure. Thus, a stable signal transmission characteristic to both signal currents indicating a signal "0" and a signal "1" can be obtained and a stable power supply is possible.

Figure 4:
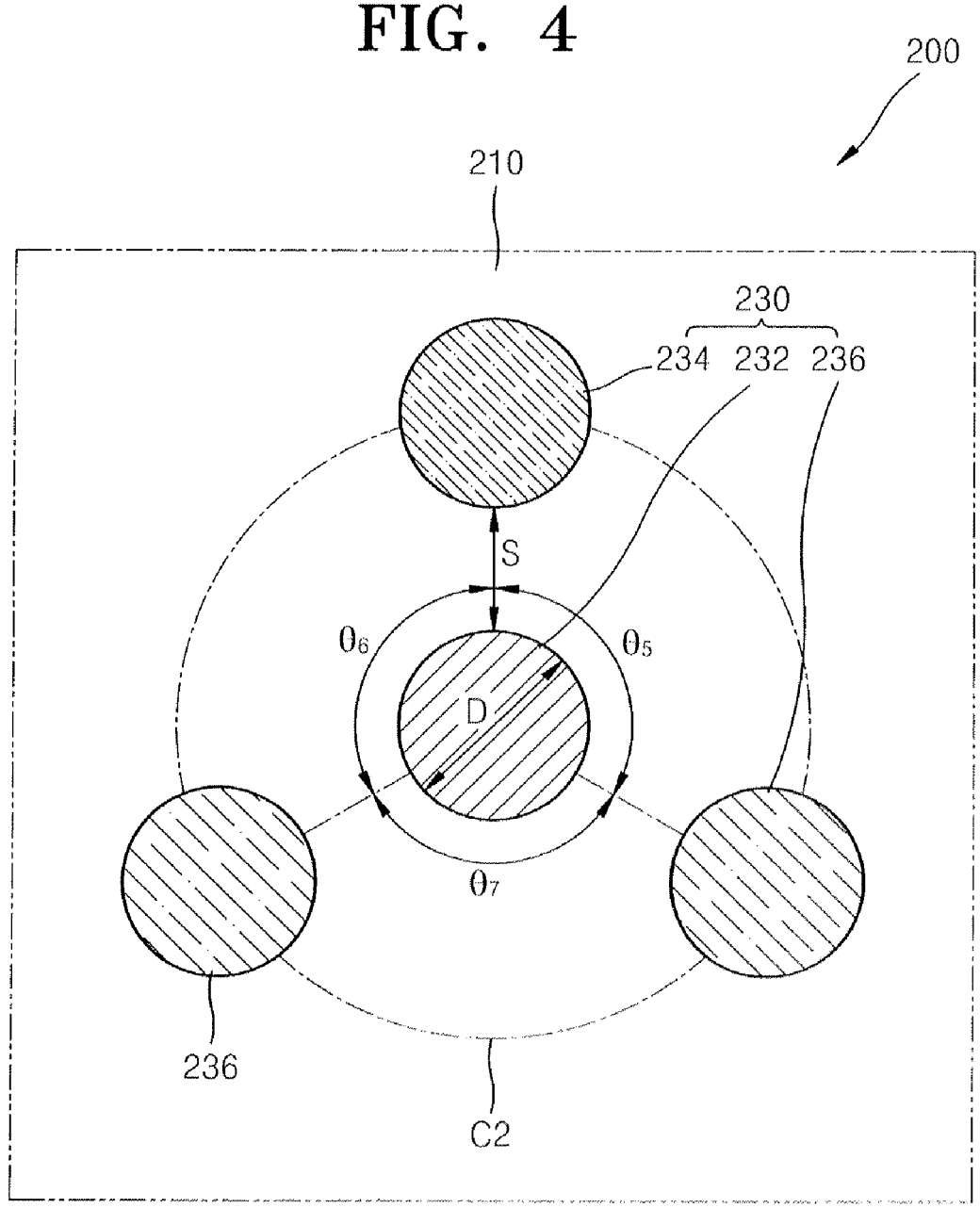
FIGS. 4 and 5 are plan views illustrating through interconnections of semiconductor chip packages according to an embodiment of the present general inventive concept.

FIG. 4 is a plan view illustrating one or more through interconnections 230 of a semiconductor chip package 200 according to an embodiment of the present general inventive concept. Referring to FIG. 4, one or more through interconnections 230 are formed on the semiconductor chip package 200 by penetrating one or more semiconductor chips 210. The through interconnections 230 include a signal interconnection 232, a power interconnection 234, and a ground interconnection 236. The power interconnection 234 and the ground interconnection 236 each are arranged to neighbor each other adjacent to the signal interconnection 232 and neighboring each other. For example, the power interconnection 234 and the ground interconnection 236 are arranged on a concentric circle C2 having a distance S from the signal interconnection 232. The distance S may be an equidistance. Accordingly, the through interconnections 230 have a quasi-coaxial structure as the power interconnection 234 and the ground interconnection 236 surrounds the signal interconnection 232 positioned at the center.

Similar to the semiconductor chip package 100 of FIG. 1, the semiconductor chip package 200 includes one or more semiconductor chips 210 each having one or more common holes formed therein such that the through interconnections 230 are disposed in the corresponding holes of the one or more semiconductor chips 210. The one or more semiconductor chips 210 can communicate with an external device to receive, store, and transmit data using the through interconnections 230. The external device may be a processing unit connected to the through interconnections 230 to control the semiconductor chip package 200.

The common holes can be formed when the one or more semiconductor chips 210 are disposed to form the semiconductor chip package 200 or can be independently formed when each of the one or more semiconductor chips 210 is formed. Therefore, the through interconnections 230 can be formed when a conductive material is formed in or inserted into the corresponding holes.

The numbers of the power interconnection 234 and the ground interconnection 236 surrounding the signal interconnection 232 may be different from each other. Accordingly, when a signal "0" or a signal "1" is supplied through the signal interconnection 232, the characteristic impedance may be adjusted to be different from each other. For example, when a switching device such as a CMOS inverter connected to the signal interconnection 232 is used, the characteristic impedance during pull-up and pull-down may be adjusted to be different from each other. Also, by adjusting the angles made by the lines connecting the signal interconnection 232 and either the power interconnection 234 or the ground interconnection 236, the characteristic impedance when a signal "0" or a signal "1" is supplied may be further finely adjusted. For example, when the numbers of the power interconnection 234 and the ground interconnection 236 surrounding the signal interconnection 232 are, respectively, one and two, angles $\theta_5$ and $\theta_6$ between the power interconnection 234 and the ground interconnection 236 with respect to the signal interconnection 232 may be different from an angle $\theta_7$ between the ground interconnections 236.

Accordingly, in the through interconnections 230 having a quasi-coaxial structure, the distance from the signal interconnection 232 to either the power interconnection 234 or the ground interconnection 236, the diameter of the signal interconnection 232, the diameter of the power interconnection 234 or the ground interconnection 236, and the numbers and diameters of the power interconnection 234 and the ground interconnection 236 may be selectively determined such that a signal to be transmitted to the signal interconnection 232 can have a required characteristic impedance.

Figure 5:
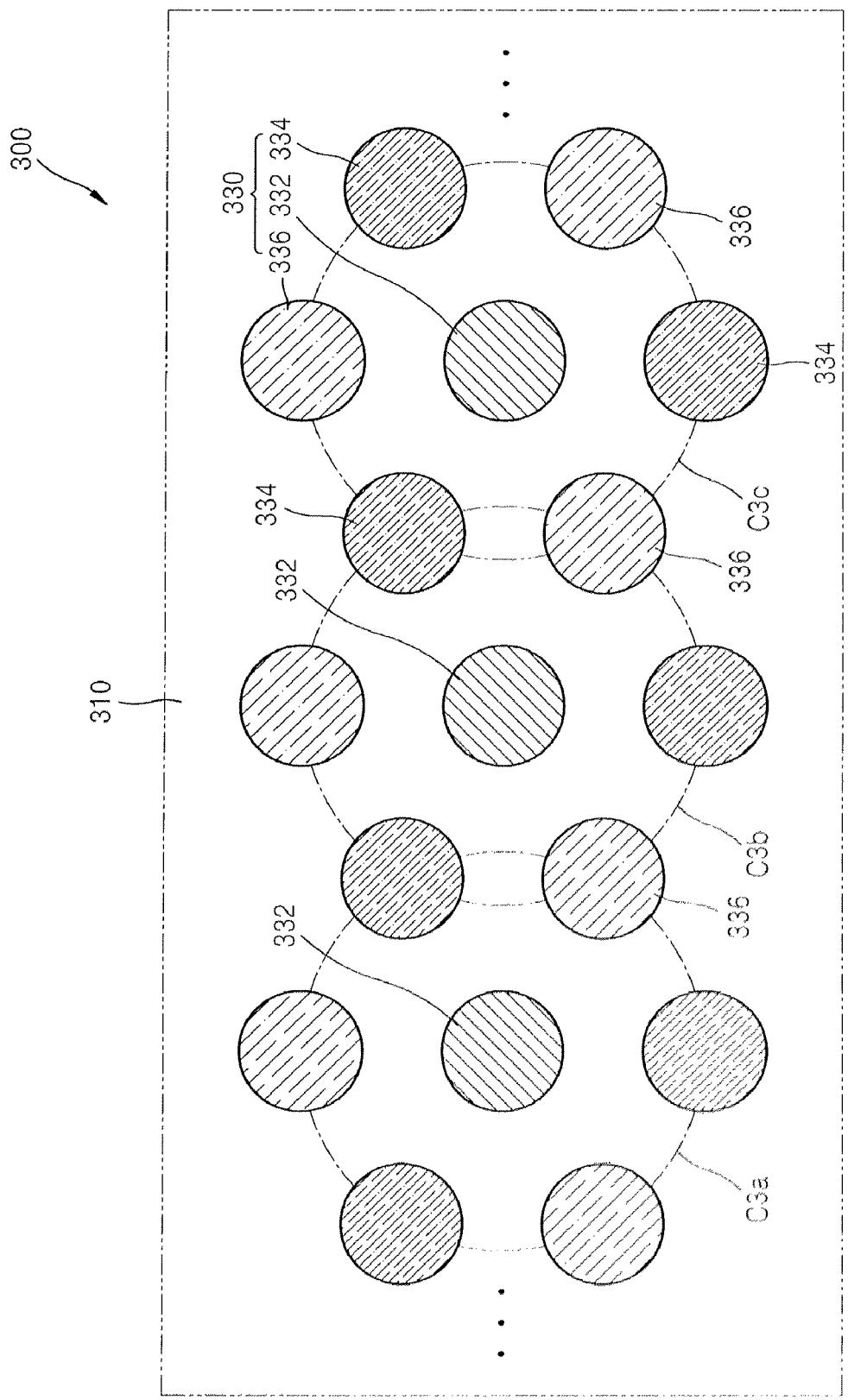

FIG. 5 is a plan view illustrating a plurality of through interconnections 330 of a semiconductor chip package 300 according to an embodiment of the present general inventive concept. Referring to FIG. 5, a plurality of signal interconnections 332 penetrating one or more semiconductor chips 310 are formed in the semiconductor chip package 300. A plurality of power interconnections 334 and ground interconnections 336 are arranged to neighbor each other adjacent to each of the signal interconnections 332. Each of the through interconnections 330 has a quasi-coaxial structure. The power interconnections 334 and the ground interconnections 336 are shared by two or more through interconnections 330 including a signal interconnection 332 at positions where concentric circles C3a and C3b, or C3b and C3c, each having the equidistance from a corresponding one of the signal interconnections 332, overlap each other.

As described above, one or more holes are formed in the one or more semiconductor chips 310 to accommodate the corresponding through interconnections 330.

The signal interconnections 332 of the through interconnections 330 are spaced apart from each other by a predetermined interval, and one or more power and ground interconnections 334 and 336 are disposed to surround a corresponding one of the signal interconnection 332. One of more of the power and ground interconnections 334 and 336 are disposed on a line disposed between the signal interconnections 332. The one of more of the power and ground interconnections 334 and 336 disposed on a line disposed between the adjacent signal interconnections 332 can be refereed to as shared interconnections to apply a potential to both the interconnections 330 which may be disposed adjacent to each other. The adjacent concentric circles can overlap each other such that the adjacent power and/or ground interconnections can be disposed in an overlap area of the adjacent concentric circles.

Figure 6:
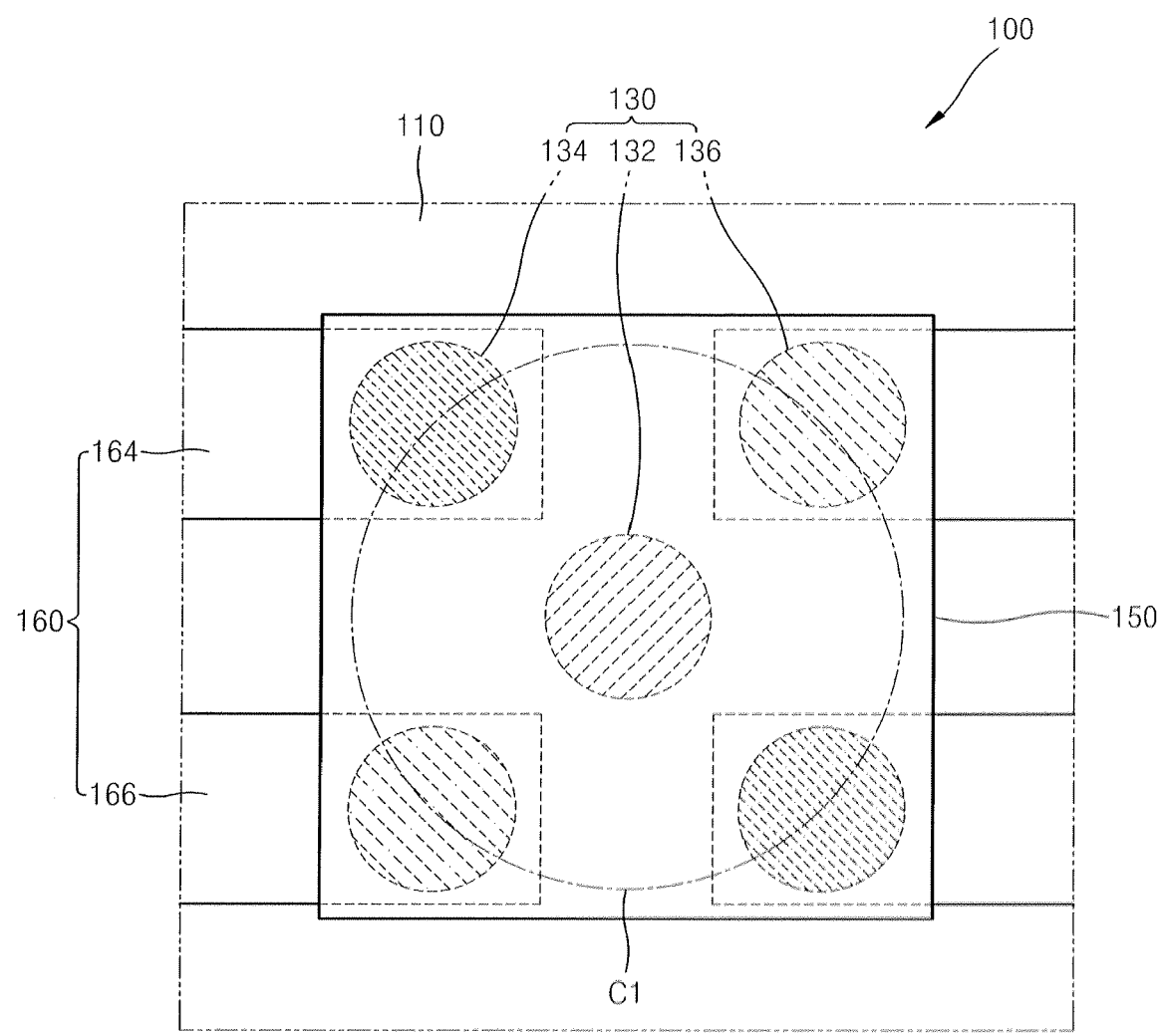
FIGS. 6 and 7 are, respectively, a plan view and a cross-sectional view illustrating a chip pad formed on through interconnections of a semiconductor chip package according to an embodiment of the present general inventive concept.

FIG. 6 is a plan view illustrating a chip pad 150 formed on the through interconnections 130 of the semiconductor chip package 100 according to an embodiment of the present general inventive concept. Referring to FIG. 6, the chip pad 150 may be formed on the signal interconnection 132, the power interconnections 134, and the ground interconnections 136 which form a quasi-coaxial structure. That is, the chip pad 150 is formed to cover all of the signal interconnection 132, the power interconnections 134, and the ground interconnections 136 forming the quasi-coaxial structure. The chip pad 150 is electrically connected to the signal interconnection 132 so that a signal from the signal interconnection 132 can be transmitted to the semiconductor chip 110. Also, the chip pad 150 may be used for electrical connection with the semiconductor chip 110 stacked above the chip pad 150. The power interconnections 134 and the ground interconnections 136 are electrically connected to redistribution wirings 160 (a power redistribution wiring 164 and a ground redistribution wiring 166) that are a conductive wiring and provide power and ground to the semiconductor chip 110.

The redistribution wirings 160 (164 and 166) are disposed opposite to each other with respect to the signal interconnection 132.

Figure 7:
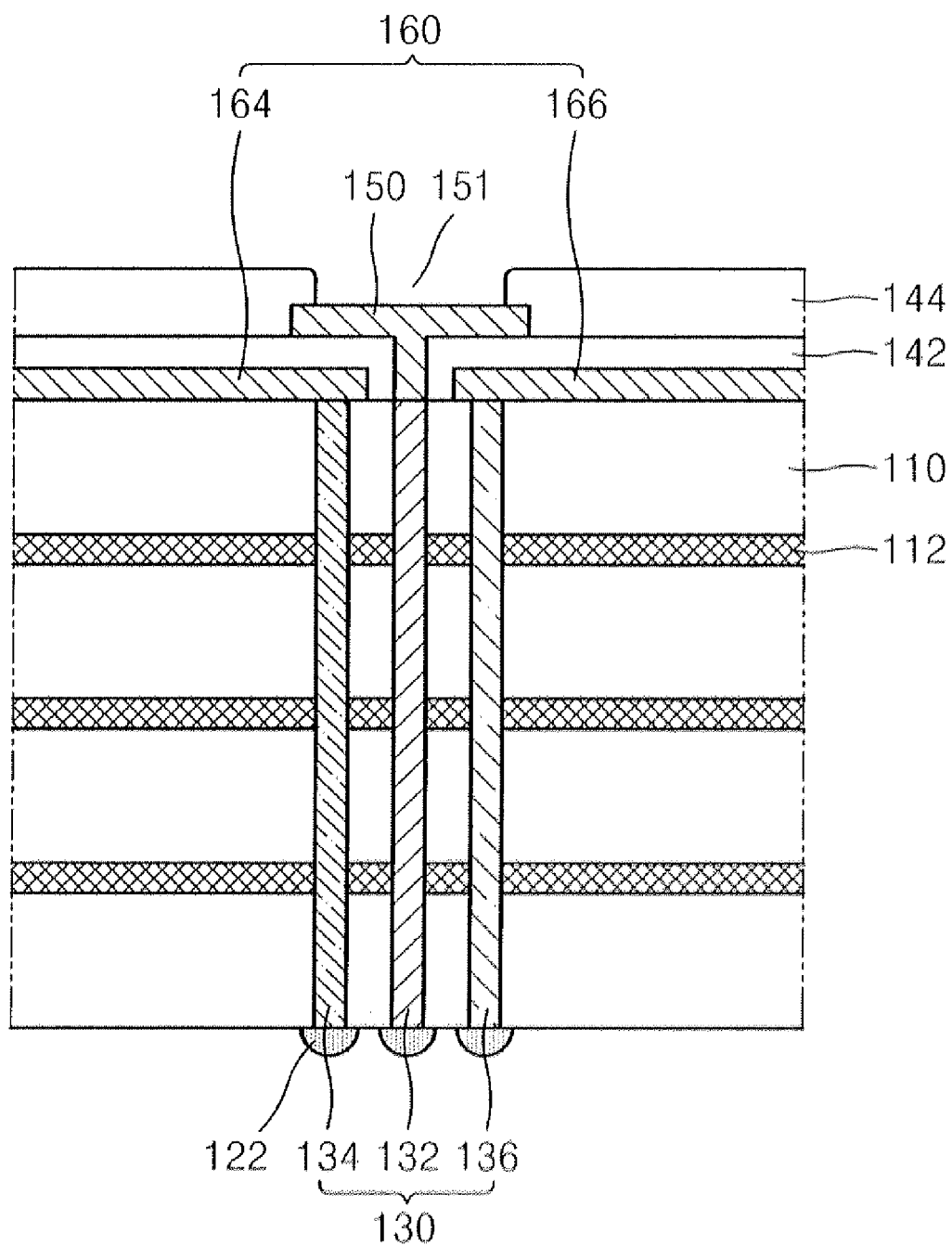

FIG. 7 is a cross-sectional view illustrating the chip pad 150 formed on the through interconnections 130 of the semiconductor chip package 100 according to an embodiment of the present general inventive concept. Referring to FIG. 7, the chip pad 150 is electrically connected to the signal interconnection 132. An insulation layer 142 may be formed under the chip pad 150 to prevent the chip pad 150 from being electrically connected directly to the power interconnection 134 or the ground interconnection 136. Although it is not illustrated in the drawing, the chip pad 150 and the redistribution wirings 160 (a power redistribution wiring 164 and a ground redistribution wiring 166) are electrically connected to a unit electronic device in the semiconductor chip 110. Also, one or more protection layers 144 to protect the chip pad 150 and an opening 151 to expose the chip pad 150 between the protection layers 144 may be further formed on the chip pad 150.

In FIG. 7, the power interconnection 134 and the ground interconnection 136 are illustrated to be arranged at both sides of the signal interconnection 132. The power interconnection 134 and the ground interconnection 136 may have a quasi-coaxial structure to surround the signal interconnection 132 and the present general inventive concept is not limited thereto. Accordingly, a cross-sectional view of FIG. 7 illustrates the signal interconnection 134, both of the power interconnection 134 and the ground interconnection 136, or either the power interconnection 134 or the ground interconnection 136.

A connection unit 122 that is electrically connected to the through interconnections 130 may be formed on an end portion of the through interconnections 130. The connection unit 122 may be, for example, a bump or a solder ball. The connection unit 122 may be connected to the through interconnections 130 directly or via the substrate where a wiring is formed.

Each of the semiconductor chips 110 may include a memory unit having memory cells to store data and a circuit as an interface to control the memory unit. The redistributing wiring 160 and the chip pad 150 may be connected to the circuit of one of the semiconductor chips 110, and the connection units 112 of the through interconnections 130 are connected to an external unit to transmit or receive data read from the corresponding memory cells or to store data in the corresponding memory cells. The external unit may be a processing unit to process the data of the memory cells using at least one through interconnection 130. It is possible that the external unit may be a unit connectable to the semiconductor chip package using a wired or wireless communication unit.

Figure 8:
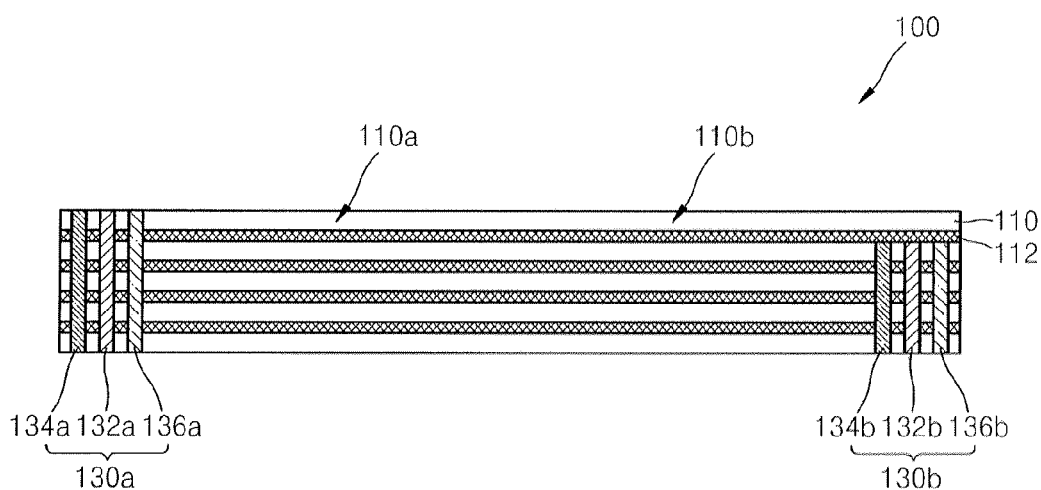
FIG. 8 is a cross-sectional view illustrating the through interconnections formed in a semiconductor chip package according to an embodiment of the present general inventive concept.

FIG. 8 is a cross-sectional view illustrating through interconnections 130a and 130b formed in the semiconductor chip package 100 according to an embodiment of the present general inventive concept. Referring to FIG. 8, one or more first through interconnections 130a including a first signal interconnection 132a, a first power interconnection 134a, and a first ground interconnection 136a, in a quasi-coaxial structure, penetrates a first number of the semiconductor chips 110 and adhesives 112 included in the semiconductor chip package 100. Also, one or more second through interconnections 130b including a second signal interconnection 132b, a second power interconnection 134b, and a second ground interconnection 136b, in a quasi-coaxial structure, penetrates a second number of the semiconductor chips 110 and adhesives 112 located in the lower portion of the semiconductor chip package 100. The first through interconnections 130a or the second through interconnections 130b may be selectively formed according to the position of the semiconductor chip 110 to which a signal, power, or ground is supplied.

The adhesives 112 may be disposed between adjacent semiconductor chips 110 to attach one of the semiconductor chips 110 to the adjacent one of the semiconductor chips 110. The adhesives 112 may electrically insulate the adjacent semiconductor chips 110 except the through interconnections 130.

The first through interconnections 130a and the second through interconnections 130b are disposed at a first portion and a second portion of the semiconductor chips 110. At least one of the semiconductor chips 110 includes only one of the first through interconnections 130a and the second through interconnections.

The first through interconnections 130a and the second through interconnections 130b are electrically connected to a corresponding circuit 110a and/or a corresponding memory structure 110b having memory cells in the semiconductor chips 110.

Figure 9:
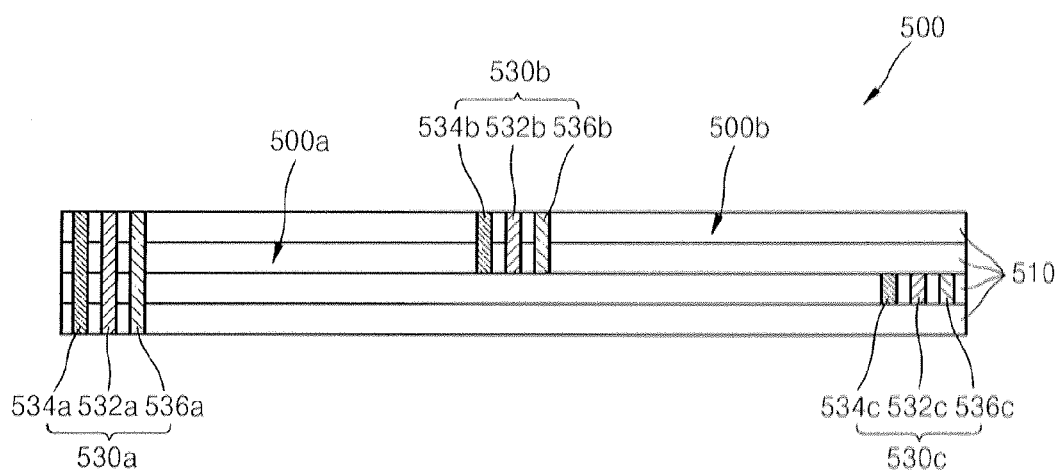
FIG. 9 is a cross-sectional view illustrating the through interconnections formed in a printed circuit board according to an embodiment of the present general inventive concept.

FIG. 9 is a cross-sectional view illustrating through interconnections formed in a printed circuit board according to an embodiment of the present general inventive concept. Referring to FIG. 9, a plurality of through interconnections 530a, 530b, and 530c having the same plane arrangement as the through interconnections described with reference to FIGS. 1-7 may be formed in a printed circuit board 500 having a multilayer structure which includes a plurality of substrates 510. That is, the through interconnections 530a, 530b, and 530c are formed by penetrating the substrates 510 of the printed circuit board 500 to be connected to an internal circuit 500a to process data, store data, and output data. The through interconnections 530a, 530b, and 530c, respectively, include signal interconnections 532a, 532b, and 532c, power interconnections 534a, 534b, and 534c, and ground interconnections 536a, 536b, and 536c. The signal interconnections 532a, 532b, and 532c are used to transmit various signals used in an electronic device (not illustrated) installed on the printed circuit board 500. The power interconnections 534a, 534b, and 534c, and the ground interconnections 536a, 536b, and 536c, respectively, provide potential, such as power and ground, needed to operate the electronic device.

The power interconnections 534a, 534b, and 534c, and the ground interconnections 536a, 536b, and 536c are, respectively, arranged to neighbor each other adjacent to the signal interconnections 532a, 532b, and 532c. For example, the power interconnections 534a, 534b, and 534c, and the ground interconnections 536a, 536b, and 536c are, respectively, arranged on a plurality of concentric circles, each having an equidistance from each of the signal interconnections 532a, 532b, and 532c. Accordingly, the signal interconnections 532a, 532b, and 532c located at the center of the concentric circles are, respectively, surrounded by the corresponding power interconnections 534a, 534b, and 534c, and the corresponding ground interconnections 536a, 536b, and 536c. The numbers of the power interconnections 534a, 534b, and 534c, and the ground interconnections 536a, 536b, and 536c, respectively, surrounding the signal interconnections 532a, 532b, and 532c, may be the same. In this case, the power interconnections 534a, 534b, and 534c, and the ground interconnections 536a, 536b, and 536c may be alternately arranged on the concentric circles having the equidistance from each of the signal interconnections 532a, 532b, and 532c. Accordingly, the through interconnections 530a, 530b, and 530c, respectively, including the signal interconnections 532a, 532b, and 532c and the power interconnections 534a, 534b, and 534c and the ground interconnections 536a, 536b, and 536c, respectively, surrounding the signal interconnections 532a, 532b, and 532c, have the quasi-coaxial structure. This structure provides a superior signal transmission characteristic when a high speed signal is transmitted through the signal interconnections 532a, 532b, and 532c.

Since the arrangement of the through interconnections 530a, 530b, and 530c on a plane is the same as that formed in the semiconductor chip packages 100, 200, and 300 described with reference to FIGS. 1-7, a detailed description thereof will be omitted herein. However, the cross-sectional structures of the through interconnections 530a, 530b, and 530c formed in the printed circuit board 500 may be different from those in the semiconductor chip packages 100, 200, and 300.

The through interconnections 530a, 530b, and 530c formed in the printed circuit board 500 may be used to directly supply a signal, power or ground to an external device. However, a plurality of conductive wirings (not illustrated) can be formed on a surface of each of the substrates 510 in the printed circuit board 500. Accordingly, the through interconnections 530a, 530b, and 530c may be used to electrically connect the conductive wirings which are separated by the substrate 510.

Thus, the first through interconnections 530a penetrates all of the substrates 510. The second through interconnections 530b penetrates some of the substrates 510 from a surface of the printed circuit board 500. The third through interconnections 530c penetrates some of the substrates 510 positioned inside the printed circuit board 500.

Furthermore, as it is described with reference to FIGS. 1 and 4, since the characteristic impedance can be adjusted by changing the arrangement method of the through interconnections 530a, 530b, and 530c, a desired characteristic impedance can be obtained even when a material for forming the substrates 510 is changed.

Figure 10A:
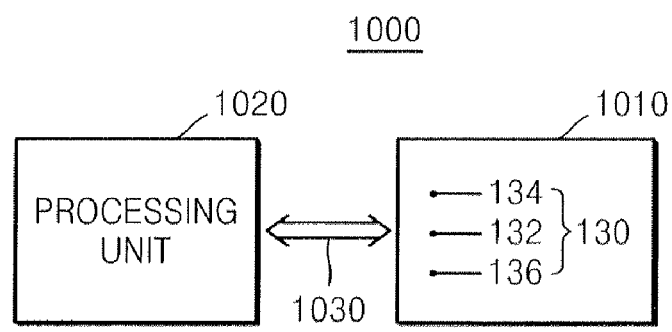
FIGS. 10A and 10B are views illustrating an apparatus having a semiconductor chip package formed with through interconnections according to an embodiment of the present general inventive concept.
Figure 10B:
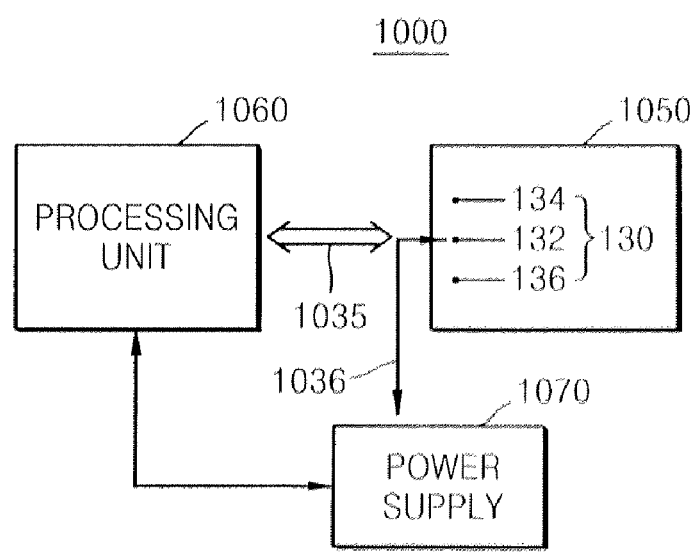

FIGS. 10A and 10B illustrate an apparatus 1000 having a semiconductor chip package formed with through interconnections according to an embodiment of the present general inventive concept. Referring to FIGS. 1-9 and 10A-10B, the apparatus 1000 includes a semiconductor chip package 1010 (1050), a processing unit 1020 (1060), and one or more communication lines 1030 (or 1035 and 1036) to connect the semiconductor chip package 1010 (1050) and the processing unit 1020 (1060) or to connect a power supply 1070 to the processing unit 1060 and the semiconductor chip package 1050. In the apparatus 1000 of FIG. 10A, it is possible that a power supply is connected to the processing unit 1020 to supply a potential (power) thereto, and then the potential is supplied to the semiconductor chip package 1010. In the apparatus 1000 of FIG. 10B, the power supply 1070 is connected to the processing unit 1060 to supply a potential (power) to the processing unit 1060, and to supply a second potential (power) to the semiconductor chip package 1050 through the communication line 1036. The communication lines 1030 and 1035 may be a data bus or a signal line. The semiconductor chip packages illustrated in FIGS. 1-9 can be used as the semiconductor chip package 101 of FIG. 10A or 10B.

When the semiconductor package 1010 (1050) is connected to the communication line 1030 (1035 and 1060), through connections 130 having a signal interconnection 132 and power and ground interconnections 134 and 136 can be connected to the communication line 1030 (1035 and 1060) in a direction parallel to corresponding center axes of the signal interconnection 132 and power and ground interconnections 134 and 136, respectively. However, the present general inventive concept is not limited thereto. It is possible that at least one of the signal interconnection 132 and power and ground interconnections 134 and 136 is connected to the corresponding one of the communication line 1030 (1035 and 1060) in a direction parallel to a corresponding center axis of the signal interconnection 132 and power and ground interconnections 134 and 136. It is also possible that at least one of the signal interconnection 132 and power and ground interconnections 134 and 136 is connected to the corresponding one of the communication line 1030 (1035 and 1060) in a direction having an angle with a corresponding center axis of the signal interconnection 132 and power and ground interconnections 134 and 136.

Figure 11A:
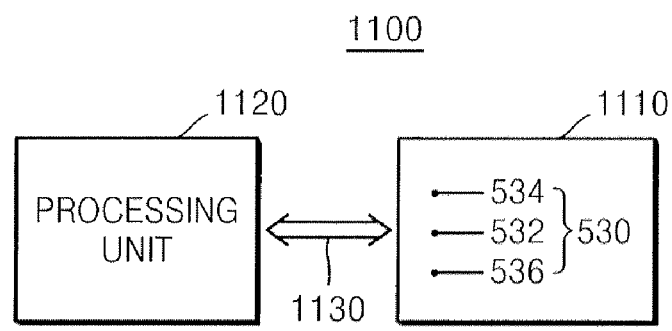
FIGS. 11A and 11B are views illustrating an apparatus having a printed circuit board formed with through interconnections according to an embodiment of the present general inventive concept.
Figure 11B:
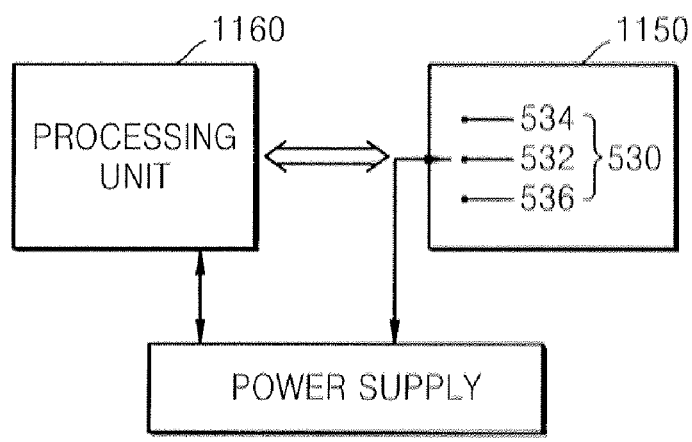

FIGS. 11A and 11B illustrate an apparatus 1100 having a printed circuit board formed with through interconnections according to an embodiment of the present general inventive concept. Referring to FIGS. 1-9 and 11A-11B, the apparatus 1100 includes a circuit board package 1110 (1150), a processing unit 1120 (1160), and one or more communication lines 1130 (or 1135 and 1136) to connect the semiconductor chip package 1110 (1150) and the processing unit 1120 (1160) or to connect a power supply 1170 to the processing unit 1060 and the circuit board package 1150. In the apparatus 1100 of FIG. 10A, it is possible that a power supply is connected to the processing unit 1020 to supply a potential (power) thereto, and then the potential is supplied to the circuit board package 1010. In the apparatus 1100 of FIG. 10B, the power supply 1170 is connected to the processing unit 1160 to supply a potential (power) to the processing unit 1160, and to supply a second potential (power) to the circuit board package 1150 through the communication line 1136. The communication lines 1130 and 1135 may be a data bus or a signal line. The printed circuit board package having one or more printed circuit substrates illustrated in FIGS. 1-9 can be used as the circuit board package 1110 of FIG. 11A or 11B When the circuit board package 1110 (1150) is connected to the communication line 1130 (1135 and 1160), through connections 530 having a signal interconnection 532 and power and ground interconnections 534 and 536 can be connected to the communication line 1130 (1135 and 1160) in a direction parallel to corresponding center axes of the signal interconnection 532 and power and ground interconnections 534 and 536, respectively. However, the present general inventive concept is not limited thereto. It is possible that at least one of the signal interconnection 532 and power and ground interconnections 534 and 536 is connected to the corresponding one of the communication line 1130 (1135 and 1160) in a direction parallel to a corresponding center axis of the signal interconnection 532 and power and ground interconnections 534 and 536. It is also possible that at least one of the signal interconnection 532 and power and ground interconnections 534 and 536 is connected to the corresponding one of the communication line 1130 (1135 and 1160) in a direction having an angle with a corresponding center axis of the signal interconnection 532 and power and ground interconnections 534 and 536.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor chip package comprising:
a signal interconnection to penetrate through a semiconductor chip and to transmit a signal to the semiconductor chip; and
a power interconnection and a ground interconnection to penetrate through the semiconductor and to supply power and ground to the semiconductor chip,
wherein the power interconnection and the ground interconnection are arranged along a concentric circle that is concentric with an outer circumference of the signal interconnection, and
a number of power interconnections and ground interconnections along the concentric circle is at least three.

2. The semiconductor chip package of claim 1, wherein the number of each of the power interconnection and the ground interconnection arranged along the concentric circle around the signal interconnection is the same plural number.

3. The semiconductor chip package of claim 1, wherein the power interconnection and the ground interconnection are equidistant from the signal interconnection.

4. The semiconductor chip package of claim 1, wherein the power interconnection includes a plurality of power interconnections and the ground interconnection includes a plurality of ground interconnections,
a number of power interconnections is the same as the number of ground interconnections, and
the power interconnections and the ground interconnections are alternately arranged on the concentric circle.

5. The semiconductor chip package of claim 4, wherein the signal interconnection includes a plurality of signal interconnections, and
at least one of the power interconnections and the ground interconnections arranged on the concentric circle of one of the plurality of signal interconnections is also arranged on the concentric circle of an adjacent signal interconnection of the plurality of interconnections.

6. The semiconductor chip package of claim 1, wherein the distance from the signal interconnection to the power interconnection or the ground interconnection, the diameter of each of the signal interconnection, the power interconnection, and the ground interconnection, or the arrangement and numbers of the power interconnection and the ground interconnection arranged to neighbor each other adjacent to the signal interconnection is determined to have a characteristic impedance required by a signal to be transmitted to the signal interconnection.

7. The semiconductor chip package of claim 1, wherein the power interconnection and the ground interconnection are respectively used as a current return path with respect to a signal current supplied to the signal interconnection.

8. The semiconductor chip package of claim 1, further comprising a chip pad electrically connecting the signal interconnection and the semiconductor chip, wherein the chip pad covers both of the power interconnection and the ground interconnection.

9. The semiconductor chip package of claim 8, further comprising a conductive wiring supplying power and ground to the semiconductor chip via the power interconnection and the ground interconnection.

10. The semiconductor chip package of claim 1, wherein the semiconductor chip includes a plurality of semiconductor chips, and
the signal interconnection, the power interconnection, and the ground interconnection penetrate all of the plurality of semiconductor chips.

11. The semiconductor chip package of claim 1, wherein the semiconductor chip includes a plurality of semiconductor chips, and the signal interconnection, the power interconnection, and the ground interconnection penetrate some of the semiconductor chips located in a lower portion of a stack of the semiconductor chips.

12. The semiconductor chip package of claim 1, wherein the semiconductor chip includes a plurality of semiconductor chips,
the signal interconnection, the power interconnection, and the ground interconnection penetrate all of the plurality of semiconductor chips, and
wherein the semiconductor chip package further comprises a connection unit to electrically connect to the signal interconnection, the power interconnection, and the ground interconnection at end portions of the signal interconnection, the power interconnection, and the ground interconnection and electrically connecting an external device or a printed circuit board.

13. The semiconductor chip package of claim 1, wherein a total number of power interconnections and ground interconnections along the concentric circle is either three or greater than four.

14. A printed circuit board having a multilayer structure including a plurality of substrates, the printed circuit board comprising:

a signal interconnection to penetrate through at least one of the substrates and to transmit a signal; and
a power interconnection and a ground interconnection to penetrate through the substrate that the signal interconnection penetrates, and to respectively supply power and ground,
wherein the power interconnection and the ground interconnection are arranged along a concentric circle corresponding to an outer circumference of the to the signal interconnection, and
a number of power interconnections and ground interconnections along the concentric circle is at least three.

15. The printed circuit board of claim 14, wherein the number of each of the power interconnection and the ground interconnection arranged to neighbor each other adjacent to the signal interconnection is the same plural number.

16. The printed circuit board of claim 14, wherein each point of the concentric circle is equidistant from the outer circumference of the signal interconnection.

17. The printed circuit board of claim 14, wherein the power interconnection includes a plurality of power interconnections and the ground interconnection includes a plurality of ground interconnections,
a number of the plurality of power interconnections is the same as a number of the plurality of ground interconnections, and
the power interconnections and the ground interconnections are alternately arranged on the concentric circle.

18. The printed circuit board of claim 17, wherein the power interconnections and the ground interconnections are arranged on line forming an equal angle with respect to the signal interconnection.

19. The printed circuit board of claim 17, wherein the signal interconnection includes a plurality of signal interconnections, and
at least one of the power interconnections and ground interconnections around the concentric circle of one of the plurality of signal interconnections is also along a concentric circle of an adjacent signal interconnection of the plurality of signal interconnections.

* * * * *